US012808033B2

(12) United States Patent
Seol et al.

(10) Patent No.: US 12,808,033 B2
(45) Date of Patent: Nov. 24, 2026

(54) DEPOSITION APPARATUS

(71) Applicant: Samsung Display Co., LTD., Yongin-si (KR)

(72) Inventors: Jaewan Seol, Yongin-si (KR); Min-Gyu Seo, Yongin-si (KR); Intaek Yoon, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 657 days.

(21) Appl. No.: 18/230,860

(22) Filed: Aug. 7, 2023

(65) Prior Publication Data

US 2024/0141475 A1 May 2, 2024

(30) Foreign Application Priority Data

Oct. 26, 2022 (KR) ........................ 10-2022-0139190

(51) Int. Cl.
*C23C 14/26* (2006.01)
*C23C 14/04* (2006.01)
*H05B 3/06* (2006.01)

(52) U.S. Cl.
CPC ............ *C23C 14/26* (2013.01); *C23C 14/042* (2013.01)

(58) Field of Classification Search
None
See application file for complete search history.

(56) References Cited

U.S. PATENT DOCUMENTS 4,791,261 A * 12/1988 Phinney .................... H05B 6/24 118/620
5,099,791 A * 3/1992 Tsukazaki ................ H05H 3/00 118/723 CB
6,384,383 B2 * 5/2002 Kano .................. H10P 72/0432 118/725
2021/0242049 A1 8/2021 Natarajan et al.
(Continued)

FOREIGN PATENT DOCUMENTS

CN 110629168 A * 12/2019 ............. C23C 14/26
JP 6526880 B1 * 6/1919 ............. C23C 14/26
JP H02102433 U * 8/1990
(Continued)

*Primary Examiner* — Sylvia Macarthur
(74) *Attorney, Agent, or Firm* — CANTOR COLBURN LLP

(57) ABSTRACT

A deposition apparatus includes a chamber providing an inner space and a deposition source including an accommodation module accommodating a deposition material and a heater module providing heat to the deposition material. The deposition source is accommodated in the inner space to provide the deposition material. The heater module includes a first heater cover including a surface facing the accommodation module, including an insulating material, and provided with a first through hole, a second heater cover including an insulating material and provided with a second through hole, a heater disposed between the first and second heater covers, a fixing frame coupled with the second heater cover to fix the second heater cover and provided with a fastening hole, a coupling member inserted into the first and second through holes and the fastening hole, and a shielding cover covering an end of the coupling member and including an insulating material.

20 Claims, 13 Drawing Sheets

(56) References Cited

U.S. PATENT DOCUMENTS

| | | | | | |
|---|---|---|---|---|---|
| 2024/0141475 | A1 * | 5/2024 | Seol | ........................ | C23C 14/26 |

FOREIGN PATENT DOCUMENTS

| | | | | | |
|---|---|---|---|---|---|
| KR | 100589938 | B1 * | 6/2006 | ............ | F16B 14/243 |
| KR | 20130073409 | A * | 7/2013 | .......... | H10P 72/0431 |
| KR | 101365075 | B1 | 2/2014 | | |
| KR | 101713631 | B1 | 3/2017 | | |
| KR | 1020210035204 | A | 3/2021 | | |
| KR | 1020220080419 | A | 6/2022 | | |

* cited by examiner

DEPOSITION APPARATUS

This application claims priority to Korean Patent Application No. 10-2022-0139190, filed on Oct. 26, 2022, and all the benefits accruing therefrom under 35 U.S.C. § 119, the content of which in its entirety is herein incorporated by reference.

BACKGROUND

1. Field

The disclosure relates to a deposition apparatus. More particularly, the disclosure relates to a deposition apparatus including a shielding tube and a shielding cover.

2. Description of the Related Art

Display devices, such as televisions, mobile phones, tablet computers, navigation units, and game units, include a display panel to display images. The display panel includes a plurality of pixels. Each pixel includes a driving element such as a transistor and a display element such as an organic light-emitting diode. The display element is formed by depositing an electrode and a light-emitting pattern on a substrate.

The light-emitting pattern is formed in a predetermined area using a mask through which a deposition opening is defined. In recent years, a deposition process technology using a large-area mask is being developed to improve a production yield of the display panel.

SUMMARY

The disclosure provides a deposition apparatus having a substantially high fastening force by coupling a coupling member to a fixing frame having a substantially high rigidity.

The disclosure provides a deposition apparatus including a shielding cover and a shielding tube, which is capable of preventing a short circuit of a heater.

An embodiment of the inventive concept provides a deposition apparatus including a chamber providing an inner space and a deposition source including an accommodation module accommodating a deposition material and a heater module disposed adjacent to an outer portion of the accommodation module to provide a heat to the deposition material. The deposition source is accommodated in the inner space to provide the deposition material. The heater module includes a first heater cover of which a first surface faces the accommodation module, a second heater cover facing a second surface of the first heater cover opposite to the first surface of the first heater cover, the second heater cover including an insulating material, and provided with a second through hole defined therethrough, a heater disposed between the second surface of the first heater cover and a first surface of the second heater cover, a fixing frame coupled with a second surface of the second heater cover opposite to the first surface of the second heater cover to fix the second heater cover and provided with a fastening hole defined therethrough, a coupling member inserted into the first through hole, the second through hole, and the fastening hole, and a shielding cover covering a first end of the coupling member adjacent to the accommodation module and including an insulating material. The first heater cover includes an insulating material and is provided with a first through hole defined therethrough.

In an embodiment, the deposition apparatus may further include a shielding tube inserted into the first through hole and the second through hole and including an insulating material, and the coupling member may be inserted into the shielding tube.

In an embodiment, the coupling member may include a thread defined at a second end of the coupling member opposite to the first end of the coupling member, and the thread may be coupled with the fastening hole.

In an embodiment, the shielding tube may have a height greater than a thickness of the second heater cover.

In an embodiment, at least one of the shielding cover and the shielding tube may include boron nitride with a purity of about 95% or more.

In an embodiment, the first heater cover may be provided with a discharge hole defined therethrough to correspond to a shape of the heater in a plan view, and a heat generated from the heater may be discharged through the discharge hole.

In an embodiment, at least one of the first heater cover and the second heater cover may include boron nitride with a purity of about 95% or more.

In an embodiment, an inner side surface of the first heater cover, which defines the first through hole, may have a step difference corresponding to the shielding cover.

In an embodiment, the fixing frame may have a rigidity greater than a rigidity of each of the first heater cover and the second heater cover.

In an embodiment, the heater module may be provided in plural, and at least one of the heater modules may be disposed above the accommodation module.

In an embodiment, the deposition apparatus further may include a fixing member. The first heater cover may be provided with a first fixing hole defined therethrough, the second heater cover may be provided with a second fixing hole defined therethrough, and the fixing member may be inserted into the first fixing hole and the second fixing hole.

In an embodiment, at least one of the first heater cover and the second heater cover may be provided with a seating recess corresponding to the heater to accommodate the heater.

An embodiment of the inventive concept provides a deposition apparatus including a chamber providing an inner space and a deposition source including an accommodation module accommodating a deposition material and a heater module disposed adjacent to an outer portion of the accommodation module to provide a heat to the deposition material. The deposition source is accommodated in the inner space to provide the deposition material. The heater module includes a first heater cover of which a first surface faces the accommodation module, a second heater cover facing a second surface of the first heater cover opposite to the first surface of the first heater cover, the second heater cover including a cover member provided with a second through hole defined therethrough and a protruding structure protruding from the cover member and provided with a third through hole defined therethrough, and including an insulating material, a heater disposed between the first heater cover and the cover member, a fixing frame coupled with one surface of the second heater cover to fix the second heater cover and provided with a fastening hole defined therethrough, and a coupling member inserted into the second through hole, the third through hole, and the fastening hole. The first heater cover includes an insulating material and is provided with a first through hole defined therethrough. The protruding structure is inserted into the first through hole.

In an embodiment, the deposition apparatus may further include a coupling nut. The coupling member includes a thread defined at a first end of the coupling member adjacent to the accommodation module, and the coupling nut is coupled with the thread.

In an embodiment, the coupling member may include a coupling head defined at a second end of the coupling member opposite to the first end of the coupling member, and an inner side surface of the fixing frame, which defines the fastening hole, may have a step difference corresponding to the coupling head.

In an embodiment, the deposition apparatus may further include a coupling nut. The coupling member may include a coupling head defined at a first end of the coupling member adjacent to the accommodation module and a thread defined at a second end of the coupling member opposite to the first end of the coupling member, and the coupling nut may be coupled with the thread.

In an embodiment, an inner side surface of the fixing frame, which defines the fastening hole, may have a step difference corresponding to the coupling nut.

In an embodiment, at least one of the first heater cover and the second heater cover may include boron nitride with a purity of about 95% or more.

In an embodiment, the fixing frame may have a rigidity greater than a rigidity of each of the first heater cover and the second heater cover.

In an embodiment, the heater module may be provided in plural, and at least one of the heater modules may be disposed above the accommodation module.

According to the above, as the deposition apparatus includes the shielding cover and the shielding tube, a short-circuit of the heater, which is caused by stacking of minute particles of the deposition material, is prevented.

According to above, the coupling member is coupled with the fixing frame having a substantially high rigidity, and thus, a substantially high fastening force is secured.

BRIEF DESCRIPTION OF THE DRAWINGS

The above and other advantages of the disclosure will become readily apparent by reference to the following detailed description when considered in conjunction with the accompanying drawings, in which.

DETAILED DESCRIPTION

Figure 1:
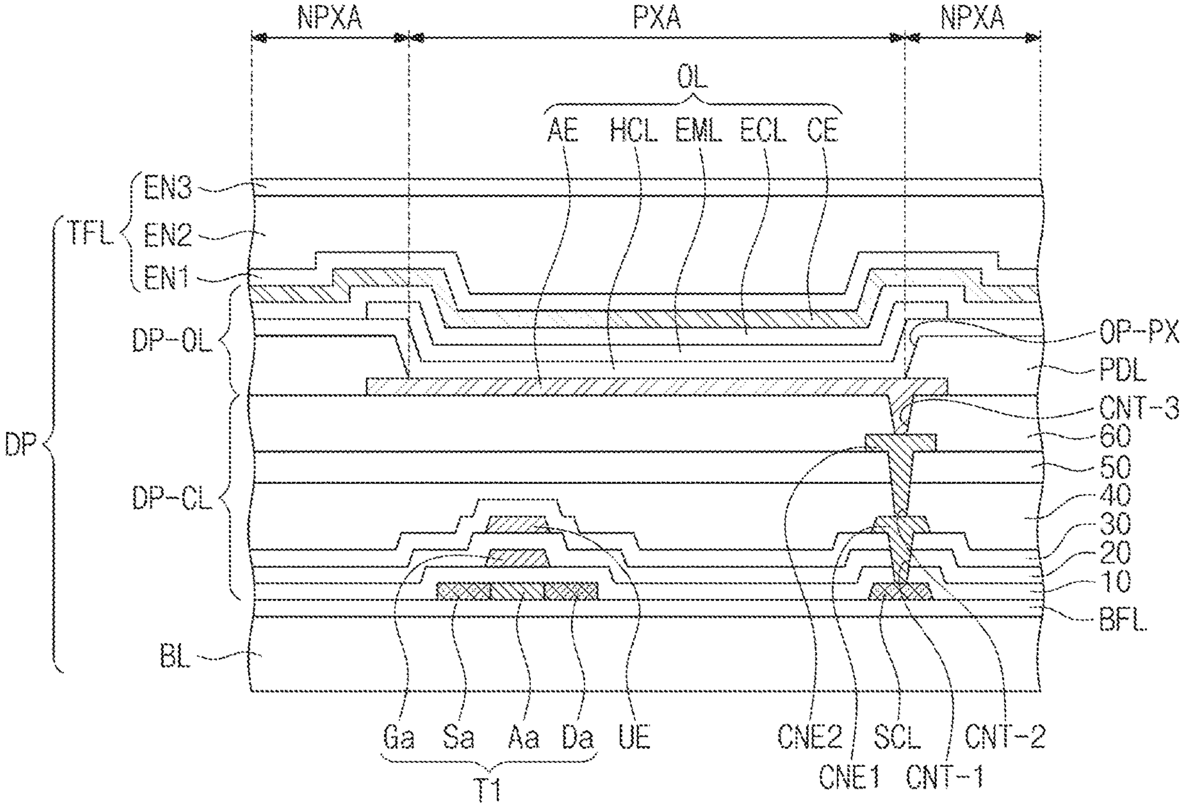
FIG. 1 is a cross-sectional view of an embodiment of a display panel according to the disclosure.

In the disclosure, it will be understood that when an element (or area, layer, or portion) is also referred to as being "on", "connected to" or "coupled to" another element or layer, it may be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

FIG. 1 is a cross-sectional view of an embodiment of a display panel DP according to the disclosure. A deposition apparatus ED (refer to FIG. 2) in an embodiment of the disclosure may be used to form at least a portion of functional layers included in the display panel DP. FIG. 1 shows a cross-section of the display panel DP manufactured using the deposition apparatus ED (refer to FIG. 2).

The display panel DP may be a light-emitting type display panel. In an embodiment, the display panel DP may be an organic light-emitting display panel, an inorganic light-emitting display panel, or a quantum dot light-emitting display panel, for example. A light-emitting layer of the organic light-emitting display panel may include an organic light-emitting material. A light-emitting layer of the inorganic light-emitting display panel may include an inorganic light-emitting material. Alight-emitting layer of the quantum dot light-emitting display panel may include a quantum dot or a quantum rod. Hereinafter, the organic light-emitting display panel will be described as an illustrative embodiment of the display panel DP.

The display panel DP may include a plurality of pixels. Each of the pixels may include at least one transistor T1 and a light-emitting element OL. FIG. 1 shows an area of pixels of the display panel DP in which the one transistor T1 and the light-emitting element OL are disposed. Referring to FIG. 1, the display panel DP may include a base layer BL, a circuit element layer DP-CL, a display element layer DP-OL, and an encapsulation layer TFL.

The base layer BL may provide a base surface on which the circuit element layer DP-CL is disposed. The base layer BL may include a synthetic resin layer. The synthetic resin layer may be formed on a support substrate used when the display panel DP is manufactured, and a conductive layer and an insulating layer may be formed on the synthetic resin layer. Then, the support substrate may be removed, and the synthetic resin layer from which the support substrate is removed may correspond to the base layer BL.

One or more inorganic layers may be disposed on an upper surface of the base layer BL. The inorganic layers may form a barrier layer and/or a buffer layer. FIG. 1 shows a structure in which the buffer layer BFL is disposed on the base layer BL. The buffer layer BFL may increase a cohesion between the base layer BL and a semiconductor pattern of the circuit element layer DP-CL.

The circuit element layer DP-CL may be disposed on the buffer layer BFL. The circuit element layer DP-CL may include at least one insulating layer and a circuit element. The circuit element may include a signal line and a pixel driving circuit. An insulating layer, a semiconductor layer, and a conductive layer may be formed by a coating or depositing process. Then, the insulating layer, the semiconductor layer, and the conductive layer may be patterned by a photolithography process, and the circuit element layer DP-CL may be formed.

The circuit element layer DP-CL may include the transistor T1, a connection signal line SCL, connection electrodes CNE1 and CNE2, and a plurality of insulating layers 10 to 60. The insulating layers 10 to 60 may include first, second, third, fourth, fifth, and sixth insulating layers 10, 20, 30, 40, 50, and 60 sequentially stacked on the buffer layer BFL. Each of the first to sixth insulating layers 10 to 60 may include one of an inorganic layer and an organic layer.

The transistor T1 may include the semiconductor pattern including a source area Sa, an active area Aa, and a drain area Da and a gate electrode Ga. The semiconductor pattern of the transistor T1 may include polysilicon, however, it should not be limited thereto or thereby. In an embodiment, the semiconductor pattern may include amorphous silicon or a metal oxide.

The semiconductor pattern may include a plurality of areas distinguished from each other depending on whether it is doped or a metal oxide is reduced. An area of the semiconductor pattern, which has a relatively great conductivity, may serve as an electrode or a signal line, and may correspond to the source area Sa and the drain area Da of the transistor T1. A non-doped or non-reduced area of the semiconductor pattern, which has a relatively small conductivity, may correspond to the active area Aa (or a channel area) of the transistor T1.

The connection signal line SCL may be formed from the semiconductor pattern, and the connection signal line SCL, the source area Sa, the active area Aa, and the drain area Da of the transistor T1 may be disposed in the same layer. In an embodiment, the connection signal line SCL may be electrically connected to the drain area Da of the transistor T1 in a plan view.

The first insulating layer 10 may cover the semiconductor pattern of the circuit element layer DP-CL. The gate electrode Ga may be disposed on the first insulating layer 10. The gate electrode Ga may overlap the active area Aa when viewed in the plane. The gate electrode Ga may serve as a mask in a process of doping the semiconductor pattern. An upper electrode UE may be disposed on the second insulating layer 20. The upper electrode UE may overlap the gate electrode Ga.

A first connection electrode CNE1 and a second connection electrode CNE2 may be disposed between the transistor T1 and the light-emitting element OL and may electrically connect the transistor T1 to the light-emitting element OL. The first connection electrode CNE1 may be disposed on the third insulating layer 30 and may be connected to the connection signal line SCL via a contact hole CNT-1 defined through the first, second, and third insulating layers 10, 20, and 30. The second connection electrode CNE2 may be disposed on the fifth insulating layer 50 and may be connected to the first connection electrode CNE1 via a contact hole CNT-2 defined through the fourth and fifth insulating layers 40 and 50.

The display element layer DP-OL may be disposed on the circuit element layer DP-CL. The display element layer DP-OL may include the light-emitting element OL and a pixel definition layer PDL. The light-emitting element OL may include a first electrode AE, a second electrode CE, and an intermediate layer disposed between the first electrode AE and the second electrode CE. The first electrode AE and the second electrode CE may include a conductive material. The intermediate layer may include at least one organic layer, and in the illustrated embodiment, the intermediate layer may include a hole control layer HCL, a light-emitting layer EML, and an electron control layer ECL, however, it should not be limited thereto or thereby. In an embodiment, the intermediate layer may include an additional layer in addition to the hole control layer HCL, the light-emitting layer EML, and the electron control layer ECL, or at least one of the hole control layer HCL, the light-emitting layer EML, and the electron control layer ECL may be omitted, and they should not be limited thereto or thereby.

The first electrode AE and the pixel definition layer PDL may be disposed on the sixth insulating layer 60. The first electrode AE may be connected to the second connection electrode CNE2 via a contact hole CNT-3 defined through the sixth insulating layer 60. The pixel definition layer PDL may be provided with a light-emitting opening OP-PX defined therethrough to expose at least a portion of the first electrode AE, and the portion of the first electrode AE exposed through the light-emitting opening OP-PX may correspond to a light-emitting area PXA. A non-light-emitting area NPXA may surround the light-emitting area PXA.

The hole control layer HCL and the electron control layer ECL may be commonly disposed in the light-emitting area PXA and the non-light-emitting area NPXA. The light-emitting layer EML may be formed in a pattern form to correspond to the light-emitting opening OP-PX. The light-emitting layer EML having the pattern form may be formed using the deposition apparatus ED (refer to FIG. 2).

Different from the hole control layer HCL and the electron control layer ECL, each having a film shape, the light-emitting layer EML may be deposited in a different way. In an embodiment, the hole control layer HCL and the electron control layer ECL may be commonly formed in the pixels using a mask referred to as an open mask. The light-emitting layer EML may be formed differently depending on the pixels using a mask referred to as a fine metal mask ("FMM").

The encapsulation layer TFL may include a plurality of thin layers. The encapsulation layer TFL may include first, second, and third thin layers EN1, EN2, and EN3 sequentially stacked. Each of the first, second, and third thin layers EN1, EN2, and EN3 may include one of the inorganic layer and the organic layer. The inorganic layer may protect the light-emitting element OL from moisture and/or oxygen. The organic layer may protect the light-emitting element OL from a foreign substance such as dust particles. However, the configurations of the encapsulation layer TFL should not be limited thereto or thereby as long as the light-emitting element OL is protected or a light-emitting efficiency is improved.

Figure 2:
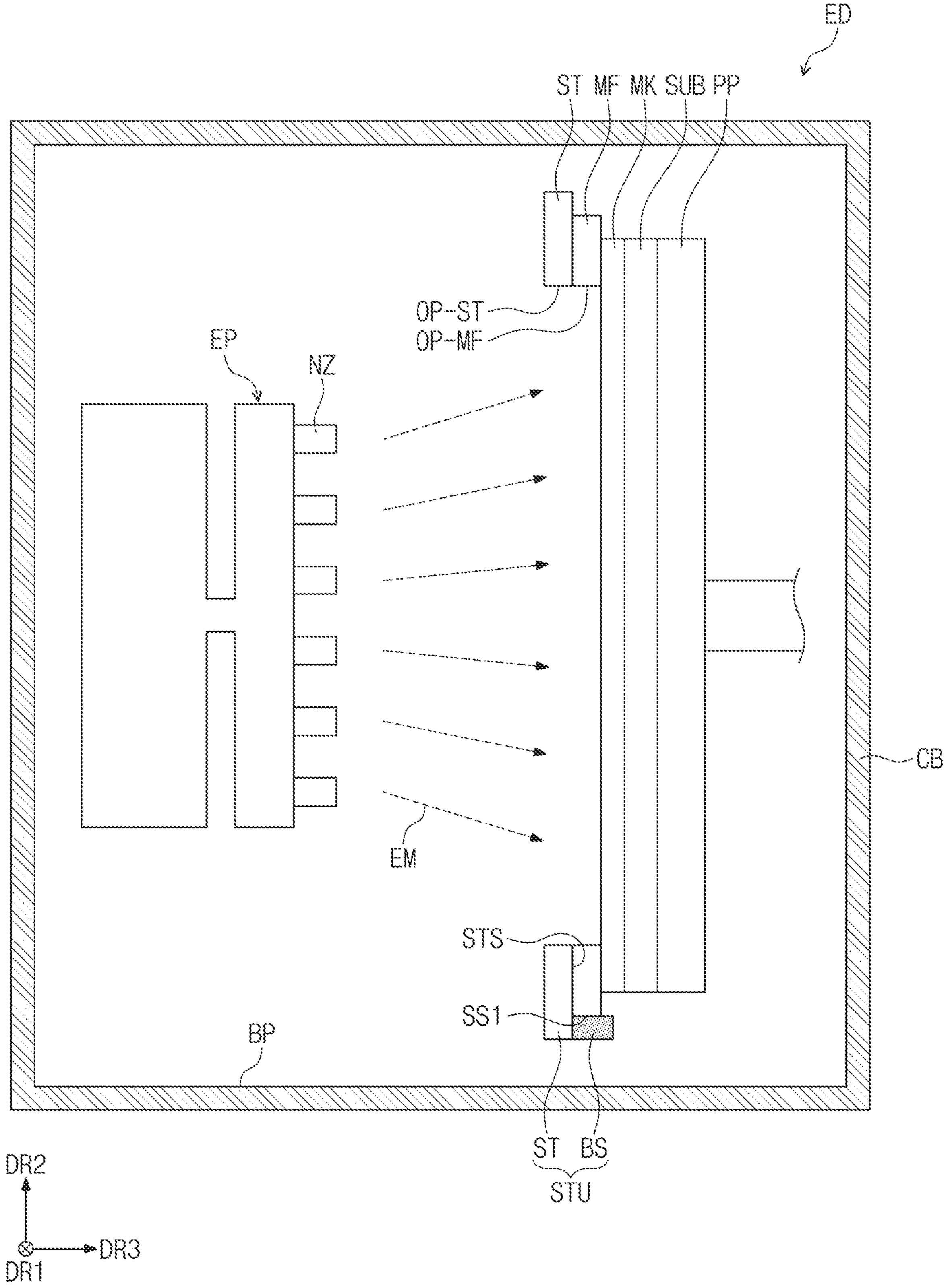
FIG. 2 is a cross-sectional view of an embodiment of a deposition apparatus according to the disclosure.

FIG. 2 is a cross-sectional view of an embodiment of the deposition apparatus ED according to the disclosure.

Referring to FIG. 2, the deposition apparatus ED may include a chamber CB, a deposition source EP, a fixing member PP, a mask MK, a mask frame MF, a stage ST, and a lower support unit BS. Although not shown in drawing figures, the deposition apparatus ED may further include additional mechanical apparatuses to implement an inline system.

The chamber CB may provide an inner space therein, and the deposition source EP, the fixing member PP, the mask MK, the mask frame MF, and a stage unit STU may be disposed in the inner space of the chamber CB. The chamber CB may form an enclosed space, and a deposition condition of the chamber CB may be set to a vacuum state. The chamber CB may include at least one gate and may be opened or closed by the gate. The stage unit STU, the mask MK, the mask frame MF, and a substrate SUB may enter and exit through the gate provided to the chamber CB.

The chamber CB may include a bottom surface BP, a ceiling surface, and sidewalls. The bottom surface BP of the chamber CB may be substantially parallel to a plane defined by a first direction DR1 and a third direction DR3. A normal line direction of the bottom surface BP of the chamber CB may be substantially parallel to a second direction DR2. In the expression "on a plane", the plane is set based on a plane parallel to a plane defined by the first and second directions DR1 and DR2.

The fixing member PP may be disposed in the chamber CB and may fix the substrate SUB to the mask MK. The fixing member PP may include a jig or a robot arm to hold the mask MK. The fixing member PP may include magnetic substances to attach the mask MK to the substrate SUB. In an embodiment, the magnetic substances may generate a magnetic force to fix the mask MK, and thus, the substrate SUB disposed between the mask MK and the fixing member PP may be tightly adhered to the mask MK.

The substrate SUB may be a process target on which a deposition material EM is deposited. The substrate SUB may include a support substrate and a synthetic resin layer disposed on the support substrate. The support substrate may be removed in a later process of a manufacturing process of the display panel. The synthetic resin layer may correspond to the base layer BL of FIG. 1. The substrate SUB may include the base layer BL (refer to FIG. 1) and some components of the display panel DP (refer to FIG. 1) formed on the base layer BL (refer to FIG. 1) depending on components to be formed through the deposition process.

The deposition source EP may be disposed in the chamber CB to face the fixing member PP. The deposition source EP may include a space to accommodate the deposition material EM and at least one nozzle NZ. The deposition material EM may include an inorganic material, a metal material, or an organic material that is sublimable or vaporable. In an embodiment, the deposition material EM may include an organic light-emitting material to form the light-emitting layer EML (refer to FIG. 1), however, the deposition material EM should not be limited thereto or thereby. The sublimated or vaporized deposition material EM may be sprayed to the substrate SUB through the nozzle NZ. The deposition material EM may be deposited on the substrate SUB in a predetermined pattern after passing through the mask MK.

The stage unit STU may include the stage ST and the lower support unit BS. The stage ST may be disposed between the deposition source EP and the fixing member PP. The stage ST may support a rear surface of the mask frame MF and may be placed outside a transport path of the deposition material EM supplied from the deposition source EP to the substrate SUB.

The stage ST may include a seating surface STS on which the mask frame MF is placed and a rear surface facing the seating surface STS. The seating surface STS of the stage ST may be provided to be inclined to the bottom surface BP of the chamber CB. In an embodiment, the seating surface STS of the stage ST may be provided to be substantially perpendicular to the bottom surface BP of the chamber CB. Accordingly, the rear surfaces of the mask frame MF and the mask MK, which are disposed on the seating surface STS of the stage ST, may be provided to be substantially perpendicular to the bottom surface BP of the chamber CB, and the deposition process may be performed. Accordingly, the mask MK having a relatively large area may be prevented from sagging due to a gravity, and a deposition reliability may be improved.

However, the disclosure should not be limited thereto or thereby. In an embodiment, the seating surface STS of the stage ST may be provided to be slightly inclined with respect to the bottom surface BP of the chamber CB. In an embodiment, the seating surface STS of the stage ST may be inclined at an angle equal to or greater than about 70 degrees. In an embodiment, as the seating surface STS of the stage ST is provided so as not to be parallel to the bottom surface BP of the chamber CB, the sagging of the mask MK, which is caused by the gravity, may be prevented, and the chamber CB may be designed to allow the bottom surface BP to have a size equal to or smaller than a size of the substrate SUB. Thus, an area occupied by the chamber CB may be reduced.

The mask MK may be provided with deposition openings defined therethrough to define deposition areas. The mask frame MF may be coupled with the mask MK and may support the mask MK. The mask frame MF may include an upper surface facing the mask MK, a rear surface opposite to the upper surface and facing the seating surface STS of the stage ST, and side surfaces extending to or from the upper surface and the rear surface. The mask frame MF may include a plurality of portions that defines an opening OP-MF overlapping the deposition openings of the mask MK. That is, the mask frame MF may have a frame shape surrounding the opening OP-MF when viewed in the plane. Further, in an embodiment, the stage ST may include a plurality of portions that defines an opening OP-ST overlapping the deposition openings of the mask MK.

The lower support unit BS may be connected to the stage ST and may support the mask frame MF. The lower support unit BS may face one side surface SS1 of the mask frame MF in the second direction DR2 and may support the side surface SS1 of the mask frame MF. In the illustrated embodiment, the side surface SS1 of the mask frame MF supported by the lower support unit BS may face the bottom surface BP of the chamber CB. In the illustrated embodiment, the bottom surface BP may be substantially parallel to the side surface SS1 of the mask frame MF, however, this is merely one of embodiments. In an embodiment, the bottom surface BP may be inclined at a predetermined inclination angle with respect to the side surface SS1 of the mask frame MF. The mask frame MF may be disposed at an angle to allow the side surface SS1 of the mask frame MF to be supported by a supporting force applied in a direction parallel to the direction of gravity. That is, the lower support unit BS may support the mask frame MF that is substantially vertically seated in the chamber CB. The lower support unit BS may move in a direction parallel to the second direction DR2, and thus, a force applied to the mask frame MF may be adjusted by the lower support unit BS.

Figure 3:
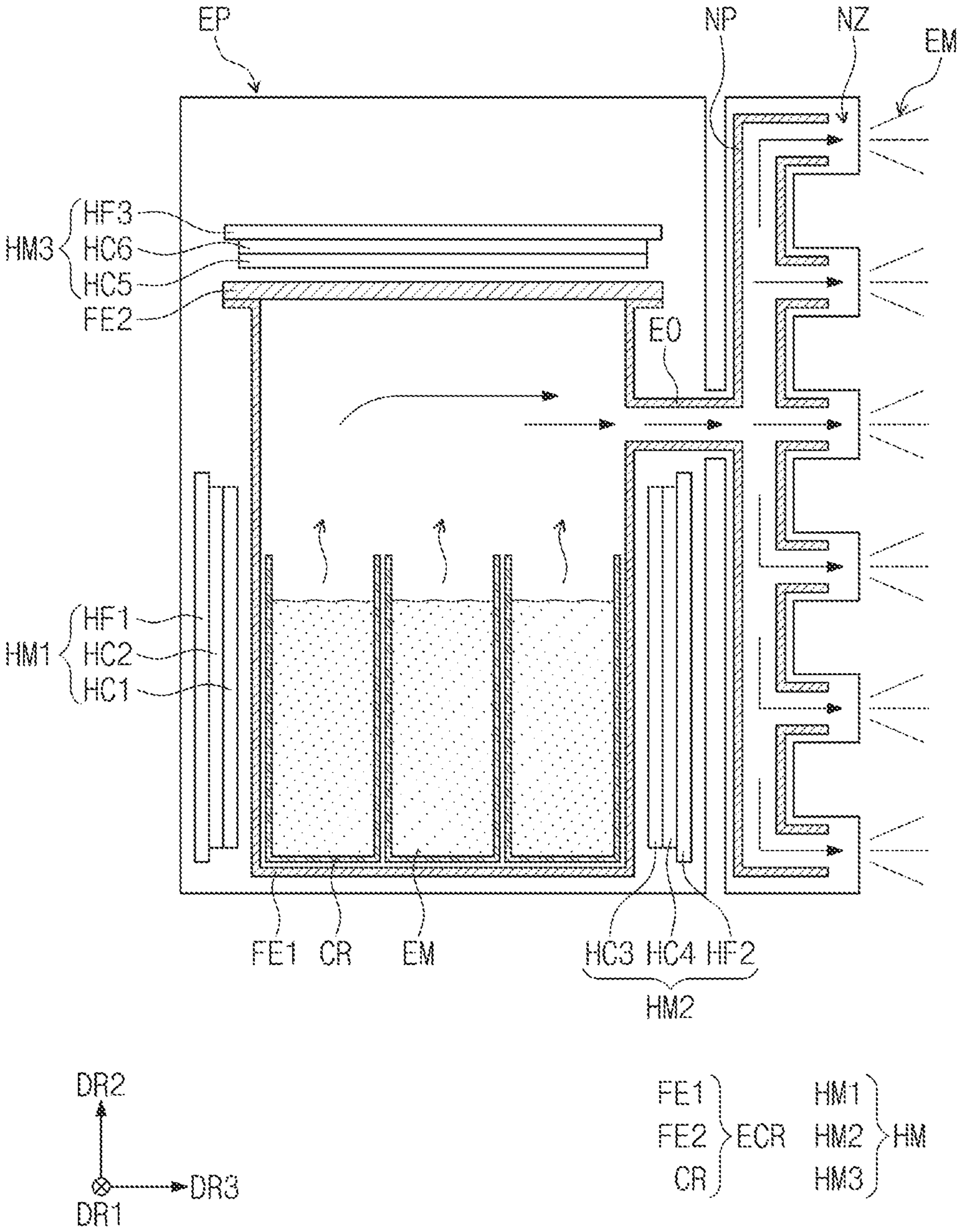
FIG. 3 is a cross-sectional view of a deposition source of FIG. 2.

FIG. 3 is a cross-sectional view of the deposition source EP of FIG. 2.

Referring to FIG. 3, the deposition source EP may include an accommodation module ECR and a heater module HM. The deposition source EP may provide the deposition material EM accommodated in an inner space defined therein. However, the deposition source EP should not be limited thereto or thereby and may further include other general-purpose components in addition to the components shown in FIG. 3.

The accommodation module ECR may accommodate the deposition material EM. The accommodation module ECR may include a lower frame FE1, an upper frame FE2, and a container, e.g., crucible CR, however, components of the accommodation module ECR should not be limited thereto or thereby. The accommodation module ECR may have various structures as long as it accommodates the deposition material EM.

The lower frame FE1 may be coupled with the upper frame FE2 to define the inner space in which the crucible CR is accommodated. The lower frame FE1 and the upper frame FE2 may include a metal material with a relatively high thermal conductivity to transmit a heat from the heater module HM to the deposition material EM accommodated in the crucible CR. In addition, the lower frame FE1 and the upper frame FE2 may include a metal material with a relatively high melting point so that deformation does not occur even at relatively high temperatures.

The lower frame FE1 may have a U-shape that is provided with an open upper surface and an empty interior and extends in the first direction DR1. An exit EO through which the sublimated or vaporized deposition material EM moves may be formed at one side surface of the lower frame FE1. The exit EO may be connected to a nozzle pipe NP connected to the nozzle NZ and may serve as a passage for the deposition material EM to travel to the nozzle NZ.

In this case, the nozzle NZ may be connected to the accommodation module ECR, and the deposition material EM may be sprayed to the substrate SUB (refer to FIG. 2). The nozzle NZ may include a splash prevention film (not shown) to prevent splashing of a deposition material, which is not yet evaporated and is in the form of a cluster. The nozzle NZ may include a metal material with excellent thermal conductivity to prevent a condensation of the deposition material EM without a separate heating device.

The upper frame FE2 may block the sublimated or vaporized deposition material EM from moving in the second direction DR2. The upper frame FE2 may be coupled with the lower frame FE1 without a gap to prevent the sublimated or vaporized deposition material EM from traveling to a place other than the exit EO.

The crucible CR may accommodate the deposition material EM that is to be deposited on the substrate SUB (refer to FIG. 2). The crucible CR may be provided with an open upper surface through which the sublimated or vaporized deposition material EM enters and exits. The crucible CR may include a material with excellent thermal conductivity to transfer the heat from the heater module HM to the deposition material EM. Accordingly, the deposition material EM may be quickly heated, and a temperature may be maintained uniformly to ensure effective deposition.

The crucible CR may include the metal material with excellent thermal conductivity to effectively heat the deposition material EM. The crucible CR may include a composite material including or consisting of the metal material. Since the crucible CR is heated to a relatively high temperature, the crucible CR may include the metal material with a relatively high melting point and little deformation even at relatively high temperatures. Particularly, since a vacuum deposition is performed at a relatively high temperature in a case where a metal material or inorganic material is used as the deposition material EM, the temperature in the crucible CR may be desired to be maintained at the relatively high temperature.

The heater module HM may be placed adjacent to an outer portion of the accommodation module ECR to provide the heat to the deposition material EM. The heater module HM may include a first heater module HM1, a second heater module HM2, and a third heater module HM3. However, the first, second, and third heater modules HM1, HM2, and HM3 of FIG. 3 are merely one of embodiments to show an arrangement of the heater module HM, and the number of the heater modules HM may increase or decrease as desired.

The first heater module HM1 and the second heater module HM2 may be respectively disposed at left and right sides of the accommodation module ECR and may provide the heat to the deposition material EM. The third heater module HM3 may be disposed at an upper side of the accommodation module ECR and may provide the heat to the deposition material EM. In the case of vertical deposition (refer to FIG. 2) in which the substrate SUB (refer to FIG. 2) is placed to be perpendicular to a ground and the deposition material EM is sprayed along the third direction DR3, the heater module HM may be disposed above the accommodation module ECR like the third heater module HM3 shown in FIG. 3. Since the third heater module HM3 is desired to withstand a self-load of a fifth heater cover HC5 and a sixth heater cover HC6 described later, the third heater module HM3 disposed above the accommodation module ECR may be desired to have a higher coupling force than the first heater module HM1 and the second heater module HM2.

The first heater module HM1 may include a first heater cover HC1, a second heater cover HC2, and a first fixing frame HF1. The second heater module HM2 may include a third heater cover HC3, a fourth heater cover HC4, and a second fixing frame HF2. The third heater module HM3 may include the fifth heater cover HC5, the sixth heater cover HC6, and a third fixing frame HF3. The first, second, and third heater modules HM1, HM2, and HM3 may be placed different positions from each other but may have substantially the same structure as each other. Hereinafter, the first heater module HM1 will be described in detail, and details of the second heater module HM2 and the third heater module HM3 will be omitted.

Figure 4:
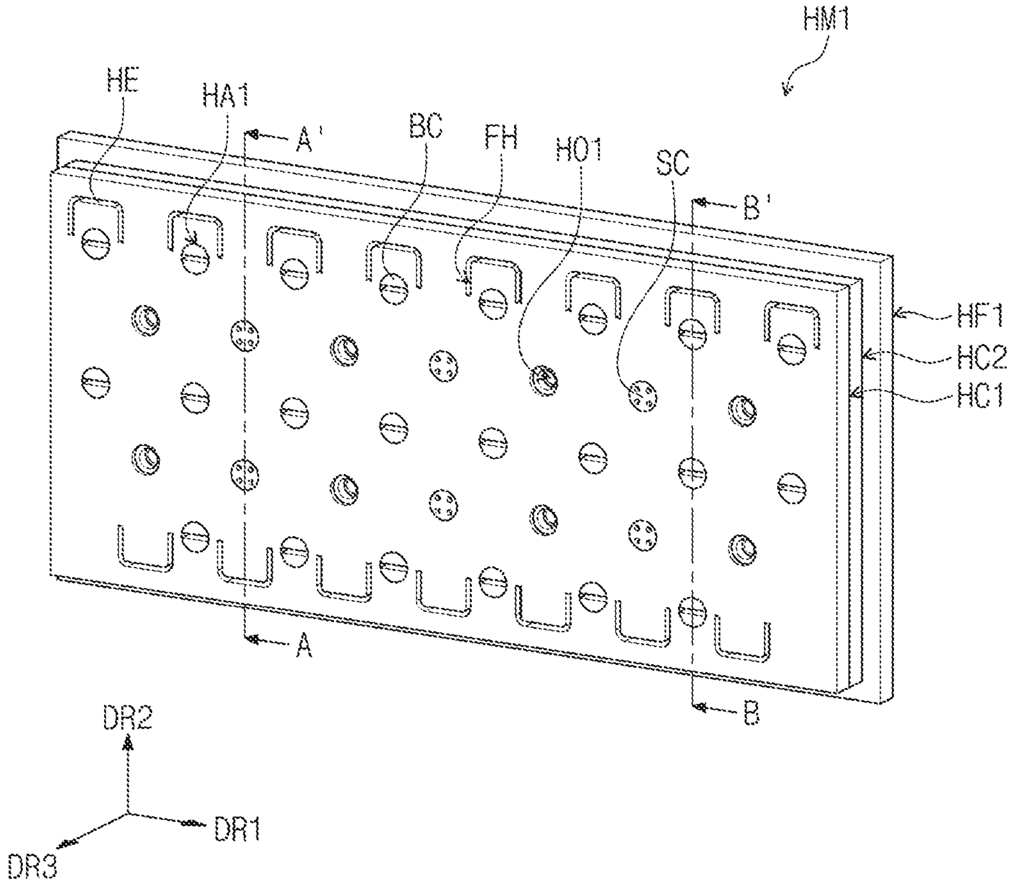
FIG. 4 is a perspective view of a first heater module of FIG. 2.
Figure 5:
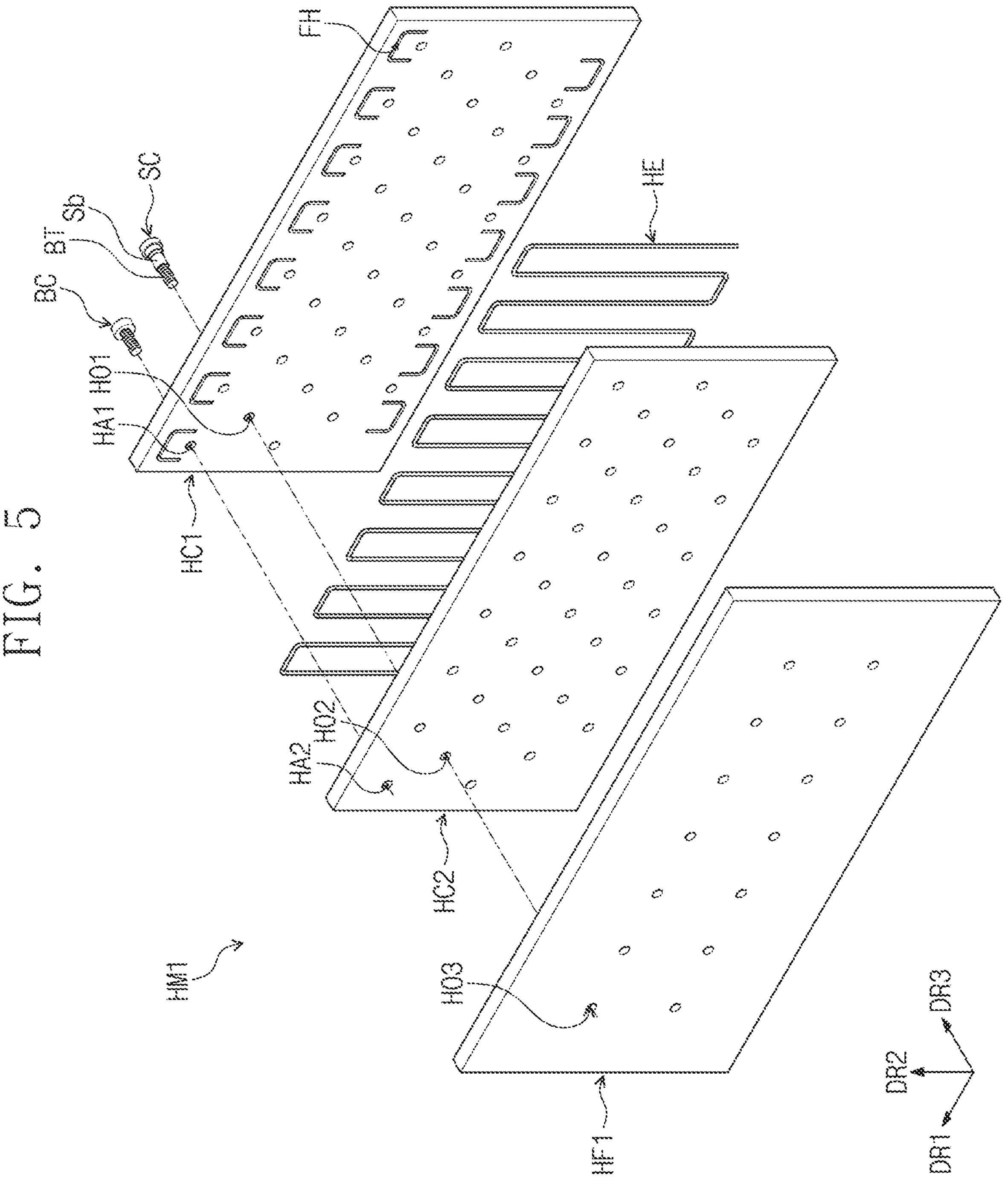
FIG. 5 is an exploded perspective view of a first heater module of FIG. 4.

FIG. 4 is a perspective view of the first heater module HM1 of FIG. 2, and FIG. 5 is an exploded perspective view of the first heater module HM1 of FIG. 4.

Referring to FIGS. 4 and 5, the first heater module HM1 may include the first heater cover HC1, the second heater cover HC2, a heater HE, and the first fixing frame HF1. However, those skilled in the art should understand that other general-purpose components other than those shown in FIGS. 4 and 5 may be further included in the first heater module HM1.

The first heater module HM1 may be a module obtained by fixing the first heater cover HC1, the second heater cover HC2, the heater HE, and the first fixing frame HF1 to each other using a coupling member BT and a fixing member BC. The first heater module HM1 may have a plate-like shape extending in one direction. A length in which the first heater module HM1 extends may vary depending on a corresponding outer side surface of the accommodation module ECR (refer to FIG. 3).

The first heater cover HC1 may be provided with a first through hole HO1 defined therethrough, and one surface of the first heater cover HC1 may face the accommodation module ECR (refer to FIG. 3). The first heater cover HC1 may prevent the sublimated or vaporized deposition material EM sprayed from the accommodation module ECR (refer to FIG. 3) from being stacked on components such as the heater HE, the coupling member BT, or the like. In addition, the first heater cover HC1 may reduce an area where the heater HE is exposed to the outside and may protect the heater HE from external impacts.

The first heater cover HC1 may have a plate-like shape with a surface area sufficient to cover the heater HE. The first heater cover HC1 may be provided with a plurality of holes, such as the first through hole HO1, a first fixing hole HAL etc., defined therethrough for the fixing with the second heater cover HC2 and the first fixing frame HF1. A seating recess SH (refer to FIG. 6) having a shape corresponding to the heater HE may be defined in the first heater cover HC1 to allow the heater HE to be seated therein.

The first heater cover HC1 may be provided with a discharge hole FH defined therethrough to correspond to the shape of the heater HE and to dissipate the heat generated from the heater HE to the outside. That is, the heater HE may convert an electrical energy into a thermal energy, and the converted thermal energy may be transferred to the deposition material EM accommodated in the accommodation module ECR (refer to FIG. 3) after passing through the discharge hole FH. However, when a size of the discharge hole FH is too large, the sublimated or vaporized deposition material EM may be deposited on the heater HE exposed through the discharge hole FH as the deposition process is repeated. In this case, when the deposition material EM is a conductive material, a short-circuit may occur in the heater HE. Accordingly, the discharge hole FH may be defined corresponding to only a shape of a portion of the heater HE to prevent the occurrence of the short-circuit. The short-circuit in the heater HE, which is caused due to the deposition material EM, will be described later with reference to FIG. 9.

The first heater cover HC1 may include an insulating material. The first heater cover HC1 may be directly in contact with the heater HE, the coupling member BT, and the first fixing frame HF1 through which electricity may flow. Accordingly, in a case where the first heater cover HC1 includes a conductive material, the electricity flowing through the heater HE may be transferred to the coupling member BT and the first fixing frame HF1 via the first heater cover HC1. That is, the electricity that needs to go through the heater HE may be short-circuited, and excessive current may flow. As a result, circuits or the heater HE may be damaged. Accordingly, the first heater cover HC1 may include the insulating material that does not conduct the electricity.

The first heater cover HC1 may include or consist of boron nitride (BN) with a purity of about 95% or more. The first heater cover HC1 is desired to have a relatively high melting point and a relatively low reactivity so that the first heater cover HC1 does not melt at relatively high temperature for the deposition. The high-purity boron nitride (BN) may meet the above conditions because the high-purity boron nitride (BN) does not melt and react at relatively high temperature. When the first heater cover HC1 includes or consists of the high-purity boron nitride (BN), the first heater cover HC1 may have a rigidity lower than a rigidity of the first fixing frame HF1 since a rigidity of boron nitride (BN) itself is not high.

However, this is merely one of embodiments of the material of the first heater cover HC1, and any material that has a relatively high melting point and a relatively low reactivity at relatively high temperature may be used as the material for the first heater cover HC1.

The second heater cover HC2 may face an opposite surface of the first heater cover HC1 opposite to the one surface of the first heater cover HC1 and may be provided with a second through hole HO2 defined therethrough. The second heater cover HC2 may protect a surface of the heater HE, which is not protected by the first heater cover HC1. The second heater cover HC2 may reduce the area where the heater HE is exposed to the outside and may protect the heater HE from external impacts.

The second heater cover HC2 may have a plate-like shape with a surface area sufficient to cover the heater HE. The second heater cover HC2 may be provided with a plurality of holes, such as the second through hole HO2, a second fixing hole HA2, etc., defined therethrough for the fixing with the first heater cover HC1 and the first fixing frame HF1. The seating recess SH (refer to FIG. 6) having the shape corresponding to the heater HE may be defined in the second heater cover HC2 to allow the heater HE to be seated therein.

The second heater cover HC2 may include an insulating material. The second heater cover HC2 may be directly in contact with the heater HE, the coupling member BT, and the first fixing frame HF1 through which electricity may flow. Accordingly, in a case where the second heater cover HC2 includes a conductive material, the electricity flowing through the heater HE may be transferred to the coupling member BT and the first fixing frame HF1 via the second heater cover HC2. That is, the electricity that needs to go through the heater HE may be short-circuited, and excessive current may flow. As a result, circuits or the heater HE may be damaged. Accordingly, the second heater cover HC2 may include the insulating material that does not conduct the electricity.

The second heater cover HC2 may include or consist of boron nitride (BN) with a purity of about 95% or more. The second heater cover HC2 is desired to have a relatively high melting point so that the second heater cover HC2 does not melt at relatively high temperature for the deposition. The high-purity boron nitride (BN) may meet the above conditions because the high-purity boron nitride (BN) does not melt at relatively high temperature. When the second heater cover HC2 includes or consists of the high-purity boron nitride (BN), the second heater cover HC2 may have a rigidity lower than the rigidity of the first fixing frame HF1 since the rigidity of boron nitride (BN) itself is not high.

However, this is merely one of embodiments of the material of the second heater cover HC2, and any material that has a relatively high melting point and a relatively low reactivity at relatively high temperature may be used as the material for the second heater cover HC2.

The heater HE may be disposed between the first heater cover HC1 and the second heater cover HC2 and may convert an electrical energy into a thermal energy. The heat generated from the heater HE may be transferred to the deposition material EM in the accommodation module ECR (refer to FIG. 3) to allow the deposition material EM to be sublimated or vaporized. The heater HE may be a heating unit such as a heating wire bent multiple times. The heater HE may be arranged in a zigzag pattern and may have a shape such as a rib, and thus, the first heater cover HC1 or the second heater cover HC2 may be prevented from sagging. The heater HE may be accommodated in the seating recess SH (refer to FIG. 6) defined in at least one of the first heater cover HC1 and the second heater cover HC2.

The first fixing frame HF1 may be coupled with one surface of the second heater cover HC2 and may fix the second heater cover HC2. The first fixing frame HF1 may have a plate-like shape with a surface area sufficient to cover the one surface of the second heater cover HC2. The first fixing frame HF1 may be provided with a fastening hole HO3 for the coupling of the first heater cover HC1 and the second heater cover HC2 with the first fixing frame HF1.

Different from the first heater cover HC1 and the second heater cover HC2, since the first fixing frame HF1 is not directly in contact with the heater HE, the first fixing frame HF1 may include a conductive material. The first fixing frame HF1 may include a material with a relatively high melting point, so that first fixing frame HF1 may not be deformed even at relatively high temperature. The first fixing frame HF1 may include a material with a rigidity sufficient to maintain its shape despite a weight of the first heater cover HC1, the second heater cover HC2, and the heater HE and the external impacts.

The coupling member BT may be inserted into the first through hole HO1, the second through hole HO2, and the fastening hole HO3 to allow the first heater cover HC1, the second heater cover HC2, and the first fixing frame HF1 to be coupled with each other. The coupling member BT may include a material having a relatively high melting point such that it does not melt at relatively high temperature and having a rigidity sufficient for the coupling of the first heater cover HC1, the second heater cover HC2, and the first fixing frame HF1. In addition, since the coupling member BT is not directly in contact with the heater HE different from the first and second heater covers HC1 and HC2, the coupling member BT may include a conductive material.

The coupling member BT may be coupled with a shielding cover SC that covers one end of the coupling member BT and includes an insulating material. The coupling member BT may be coupled with a shielding tube SB that includes an insulating material. The shielding cover SC and the shielding tube SB will be described with reference to FIG. 6.

The fixing member BC may be inserted into the first fixing hole HA' and the second fixing hole HA2 to fix the first heater cover HC1 and the second heater cover HC2.

Figure 6:
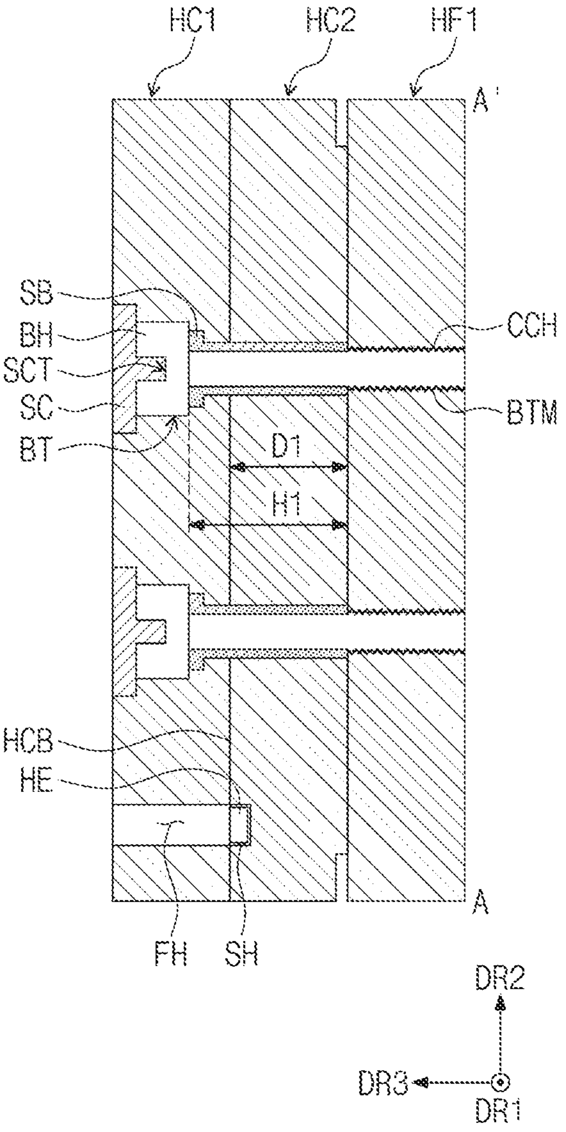
FIG. 6 is a cross-sectional view taken along line A-A' of FIG. 4.
Figure 7:
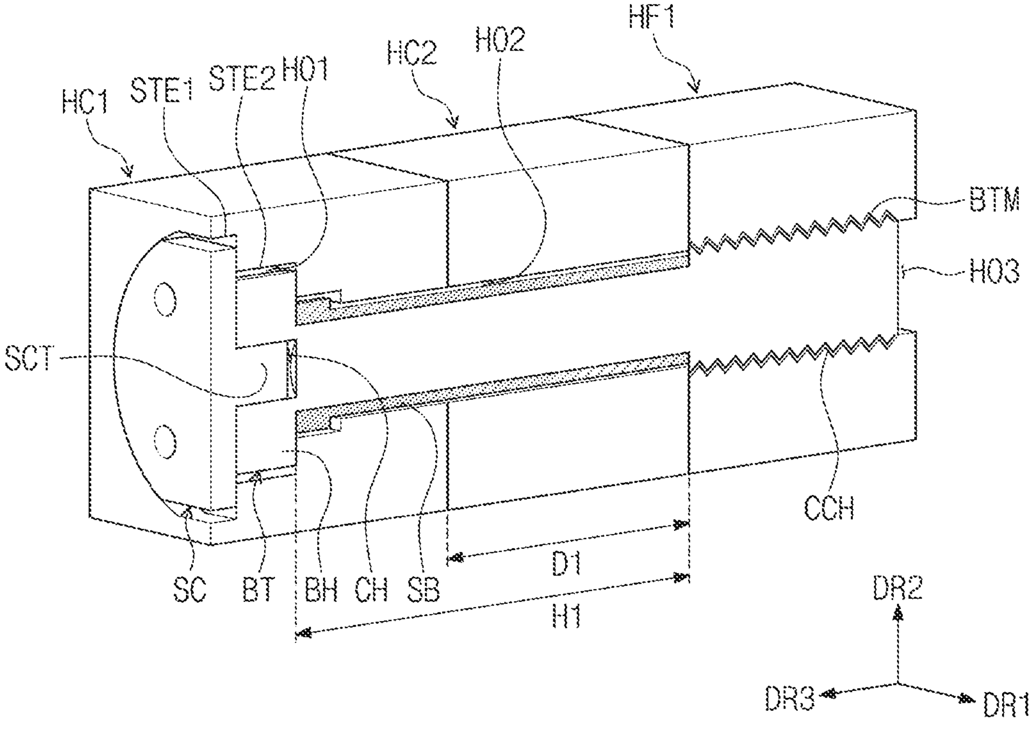
FIG. 7 is a perspective view of an assembled state of a coupling member, a shielding cover, and a shielding tube of FIG. 6.
Figure 8:
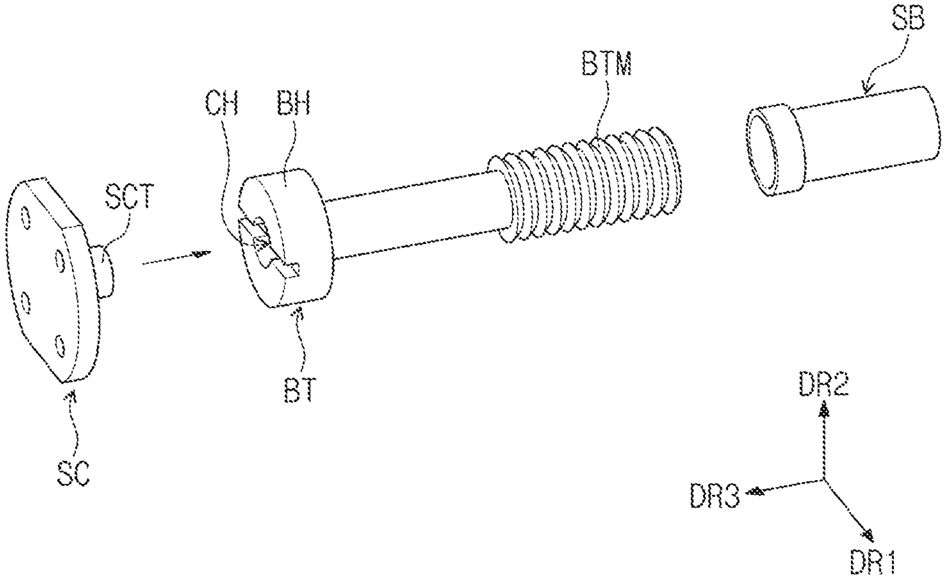
FIG. 8 is a perspective view of a coupling member, a shielding cover, and a shielding tube.

FIG. 6 is a cross-sectional view taken along line A-A' of FIG. 4, FIG. 7 is a perspective view of an assembled state of the coupling member BT, the shielding cover SC, and the shielding tube SB of FIG. 6, and FIG. 8 is a perspective view of the coupling member BT, the shielding cover SC, and the shielding tube SB.

Referring to FIGS. 6 and 7, the coupling member BT may be inserted into the first through hole HO1, the second through hole HO2, and a fastening hole HO3 and may pass through the first heater cover HC1, the second heater cover HC2, and the first fixing frame HF1. A coupling head BH may be defined in one end of the coupling member BT, which is placed in the first through hole HO1 adjacent to the accommodation module ECR (refer to FIG. 3). A thread BTM may be defined in an opposite end of the coupling member BT, which is placed in the fastening hole HO3. Here, the opposite end of the coupling member BT is opposite to the one end of the coupling member BT.

However, the shape of the coupling member BT should not be limited thereto or thereby, and the coupling member BT may have a variety of shapes such that the first heater cover HC1, the second heater cover HC2, and the first fixing frame HF1 are coupled with each other. In an embodiment, the thread BTM may not be defined in the opposite end of the coupling member BT, and in this case, the coupling member BT may be coupled by being inserted into the first through hole HO1, the second through hole HO2, and the fastening hole HO3.

The coupling head BH may be placed to contact a second stepped portion STE2 defined in an inner side surface of the first heater cover HC1, which defines the first through hole HO1. The second stepped portion STE2 may correspond to the shape of the coupling head BH, and thus, the coupling head BH may be stably fixed. In addition, a diameter of the first through hole HO1 gradually decreases due to the second stepped portion STE2 as a distance from the second heater cover HC2 decreases, and thus, the sublimated or vaporized deposition material EM may be prevented from entering the first through hole HO1.

The coupling head BH of the coupling member BT may be provided with a coupling groove CH defined therein and coupled with the shielding cover SC (refer to FIG. 8). A coupling protrusion SCT of the shielding cover SC may be coupled by being inserted into the coupling groove CH of the coupling member BT. The thread BTM of the coupling member BT may be coupled with a fastening groove CCH defined in an inner side surface of the first fixing frame HF1, which defines the fastening hole HO3.

The shielding cover SC may cover the one end of the coupling member BT, which is placed in the first through hole HO1, and may include an insulating material. The shielding cover SC may cover the coupling member BT such that the coupling head BH corresponding to the one end of the coupling member BT is not exposed to the outside. The shielding cover SC may have a plate-like shape with a diameter greater than a diameter of the coupling head BH. As described above, the shielding cover SC may shield the coupling head BH and the first through hole HO1 from the outside and may prevent the sublimated or vaporized deposition material EM from entering therein. However, the shape of the shielding cover SC should not be limited thereto or thereby and may be changed in various ways.

The shielding cover SC may include a material with a relatively high melting point and a relatively low reactivity so that the shielding cover SC does not melt at relatively high temperature. In addition, since the shielding cover SC is directly in contact with the coupling member BT, the shielding cover SC may include an insulating material. The shielding cover SC may include boron nitride (BN) with a purity of about 95% or more that meets the above conditions. However, the material for the shielding cover SC should not be limited thereto or thereby and may be changed in various ways.

The shielding cover SC may be placed to contact a first stepped portion STE1 defined in the inner side surface of the first heater cover HC1, which defines the first through hole HO1. The first stepped portion STE1 may correspond to the shape of the shielding cover SC, and thus, the shielding cover SC may be stably fixed. In addition, the diameter of the first through hole HO1 gradually decreases due to the first stepped portion STE1 as the distance from the second heater cover HC2 decreases, and thus, the sublimated or vaporized deposition material EM may be prevented from entering the first through hole HO1.

The shielding tube SB may be inserted into the first through hole HO1 and the second through hole HO2 and may include an insulating material. The shielding tube SB may have a hollow cylindrical shape into which the coupling member BT is inserted (refer to FIG. 8). A diameter of the inner side surface of the shielding tube SB may be substantially the same as a diameter of an outer side surface of a corresponding coupling member BT. The shielding tube SB may cover a portion of a side surface of the coupling member BT.

The shielding tube SB may have a height H1 greater than a thickness D1 of the second heater cover HC2. The shielding tube SB may completely pass through the second through hole HO2 and may partially pass through the first through hole HO1. The shielding tube SB may extend across a boundary surface HCB between the first heater cover HC1 and the second heater cover HC2. The shielding tube SB may be used to separate the conductive coupling member BT from the boundary surface HCB where the sublimated or vaporized deposition material EM is likely to be deposited.

The shielding tube SB may include a material with a relatively high melting point and a relatively low reactivity so that the shielding tube SB does not melt at relatively high temperature. In addition, since the shielding tube SB is directly in contact with the conductive coupling member BT, the shielding tube SB may include an insulating material. The shielding tube SB may include boron nitride (BN) with a purity of about 95% or more that meets the above conditions. However, the material for the shielding tube SB should not be limited thereto or thereby and may be changed in various ways.

Figure 9:
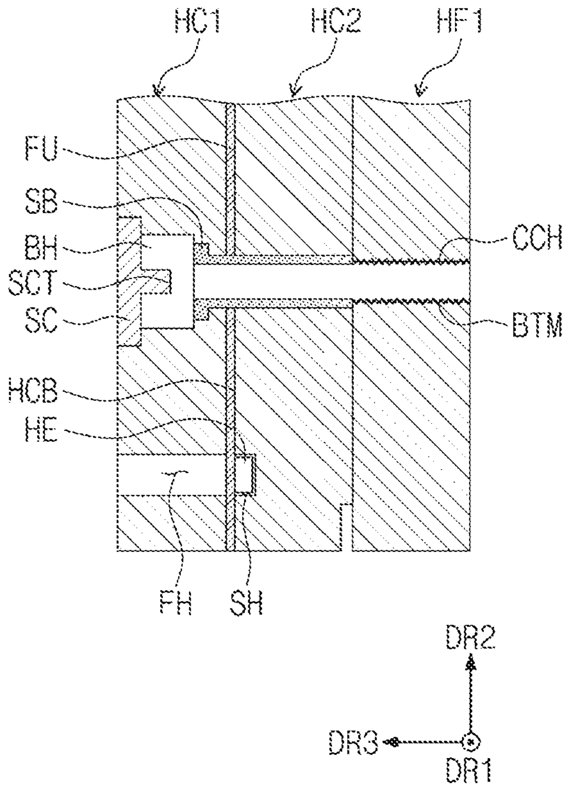
FIG. 9 is a cross-sectional view of a conductive layer formed at a boundary surface between a first heater cover and a second heater cover.

FIG. 9 is a cross-sectional view of a conductive layer FU formed at the boundary surface HCB between the first heater cover HC1 and the second heater cover HC2.

Referring to FIG. 9, the conductive layer FU may be stacked on the boundary surface HCB between the first heater cover HC1 and the second heater cover HC2. Since the plural holes HO1, HAL and FH (refer to FIG. 5) are defined through the first heater cover HC1 for the coupling and dissipation of the heat, the sublimated or vaporized deposition material EM may be stacked on the boundary surface HCB after passing through the first heater cover HC1.

When the deposition material EM is the conductive material as in the case of depositing the first and second electrodes AE and CE (refer to FIG. 1), the sublimated or vaporized deposition material EM may be stacked on the boundary surface HCB, and the conductive layer FU may be formed. In this case, when there is no shielding tube SB, the heater HE, the coupling member BT, and first fixing frame HF1 may be electrically connected to each other by the conductive layer FU, and thus, the current short circuit may occur in the heater HE.

According to the disclosure, the shielding cover SC may shield the sublimated or vaporized deposition material EM entering through the first through hole HO1, and the shielding tube SB may prevent the heater HE from being electrically connected to the coupling member BT by the conductive layer FU. Thus, the short-circuit of the heater HE through which the current flows may be prevented.

Figure 10:
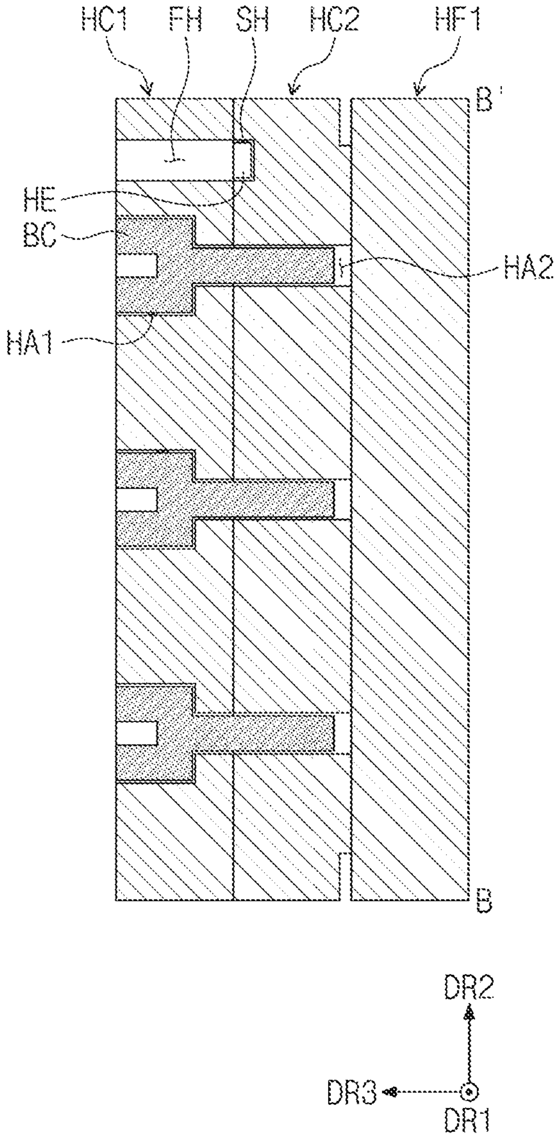
FIG. 10 is a cross-sectional view taken along line B-B' of FIG. 4.

FIG. 10 is a cross-sectional view taken along line B-B' of FIG. 4.

Referring to FIG. 10, the fixing member BC may be inserted into the first fixing hole HA' and the second fixing hole HA2, and thus, the first heater cover HC1 and the second heater cover HC2 may be fixed to each other. The first fixing hole HA' and the second fixing hole HA2 may have a shape corresponding to the shape of the fixing member BC. The fixing member BC may be coupled with the first fixing hole HA' and the second fixing hole HA2 by being inserted into the first fixing hole HA' and the second fixing hole HA2, however, the coupling method of the fixing member BC should not be particularly limited. In an embodiment, a thread (not shown) may be formed in one end of the fixing member BC, and a fastening groove (not shown) corresponding to the thread (not shown) may be defined in the first heater cover HC1 and the second heater cover HC2. Accordingly, the thread (not shown) of the fixing member BC and the fastening groove (not shown) of the first heater cover HC1 and the second heater cover HC2 may be screwed together.

The fixing member BC may provide an additional fixing force to the first heater cover HC1 and the second heater cover HC2. The fixing member BC may include a material with a relatively high melting point and a relatively low reactivity so that the fixing member BC does not melt at relatively high temperature. The fixing member BC may include an insulating material. In an embodiment, the fixing member BC may be omitted.

Figure 11:
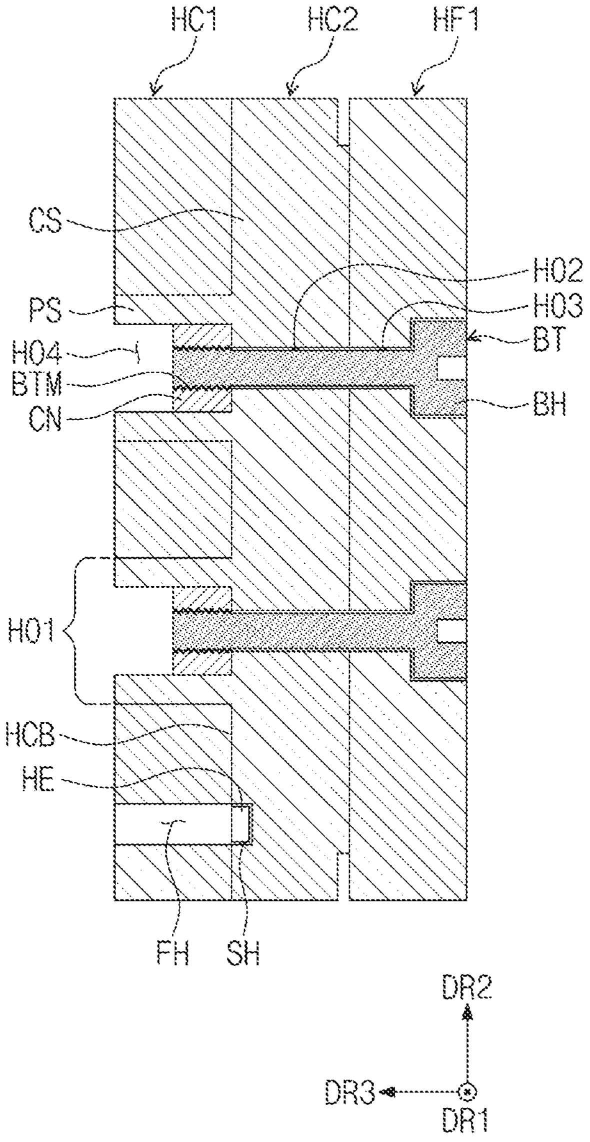
FIG. 11 is a cross-sectional view of an embodiment of a first heater cover, a second heater cover, a first fixing frame, and a coupling member according to the disclosure.

FIG. 11 is a cross-sectional view of an embodiment of a first heater cover HC1, a second heater cover HC2, a first fixing frame HF1, and a coupling member BT according to the disclosure.

Referring to FIG. 11, the second heater cover HC2 may include a cover member CS and a protruding structure PS. In FIG. 11, the same reference numerals denote the same elements described in the earlier embodiments, and thus, detailed descriptions of the same elements will be omitted.

The cover member CS may face one surface of the first heater cover HC1 and may be provided with a second through hole HO2 defined therethrough. The cover member CS may have a plate-like shape corresponding to a shape of the first heater cover HC1.

The protruding structure PS may protrude from the cover member CS and may be inserted into a first through hole HO1. The protruding structure PS may be continuous with the cover member CS and may include the same material as that of the cover member CS. The protruding structure PS may extend in the third direction DR3 along an inner side surface of the first heater cover HC1, which defines the first through hole HO1 in one side surface of the cover member CS. Since there is no space between the first heater cover HC1 and the protruding structure PS, an inflow of the sublimated or vaporized deposition material EM may be prevented.

The protruding structure PS may surround one end of the coupling member BT, which is placed in the first through hole HO1. Accordingly, the coupling member BT may not be directly in contact with the first heater cover HC1. The protruding structure PS may define a third through hole HO4 surrounded by the protruding structure PS. The third through hole HO4 may have a diameter smaller than a diameter of the first through hole HO1. The diameter of the third through hole HO4 may be substantially the same as a diameter of a coupling nut CN.

The protruding structure PS may serve as a barrier wall to block the coupling member BT and the coupling nut CN from the first heater cover HC1. A current short circuit of the heater HE may be prevented by the protruding structure PS. This will be described with reference to FIG. 12.

The coupling member BT may be inserted into the second through hole HO2, a fastening hole HO3, and the third through hole HO4. A thread BTM may be defined at the one end of the coupling member BT, which is placed in the third through hole HO4. The thread BTM may be coupled with the coupling nut CN. A coupling head BH may be defined at the opposite end of the coupling member BT. The coupling head BH may be stably fixed to the first fixing frame HF1 by a step difference of a shape corresponding to a shape of the coupling head BH defined in an inner side surface of the first fixing frame HF1, which defines the fastening hole HO3.

Since the coupling nut CN is surrounded by the protruding structure PS and the cover member CS of the second heater cover HC2 that is an insulator, the coupling nut CN may include a conductive material. The coupling nut CN may include a material with a relatively high melting point so that the coupling nut CN does not melt at relatively high temperature and with a rigidity enough to provide sufficient coupling force with respect to the coupling member BT.

Figure 12:
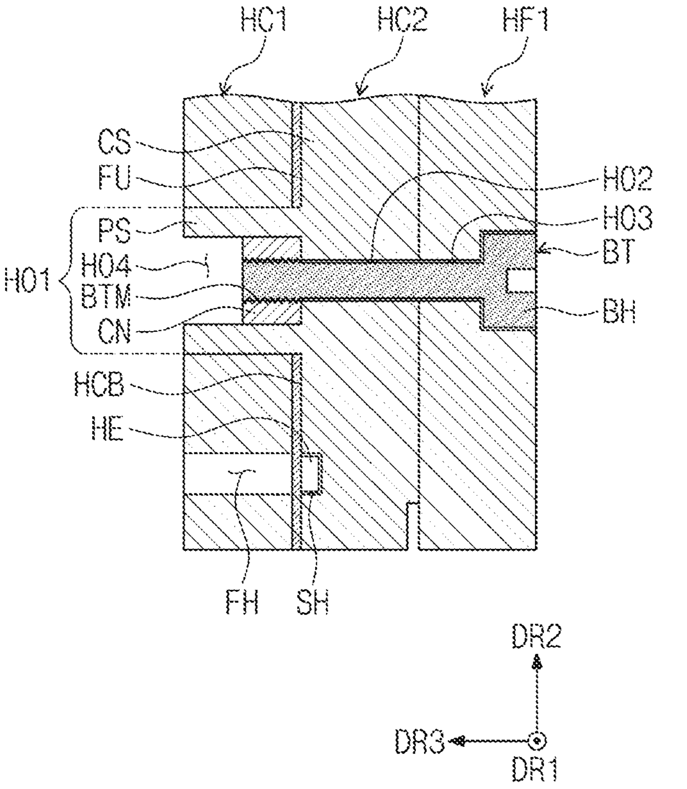
FIG. 12 is a cross-sectional view of a conductive layer formed at a boundary surface between a first heater cover and a second heater cover.

FIG. 12 is a cross-sectional view of a conductive layer FU formed at a boundary surface HCB between a first heater cover HC1 and a second heater cover HC2.

Referring to FIG. 12, the conductive layer FU may be stacked on the boundary surface HCB between the first heater cover HC1 and the second heater cover HC2. When a deposition material is the conductive material as in the case of depositing the first and second electrodes AE and CE (refer to FIG. 1), the sublimated or vaporized deposition material may be stacked on the boundary surface HCB, and the conductive layer FU may be formed. In this case, when there is no protruding structure PS including an insulating material, a heater HE, a coupling nut CN, a coupling member BT, and a first fixing frame HF1 may be electrically connected to each other via the conductive layer FU, and thus, the current short circuit may occur in the heater HE.

In the illustrated embodiment, since the protruding structure PS prevents the heater HE from being electrically connected to the coupling member BT and the coupling nut CN via the conductive layer FU, the current short circuit may be prevented from occurring in the heater HE.

Figure 13:
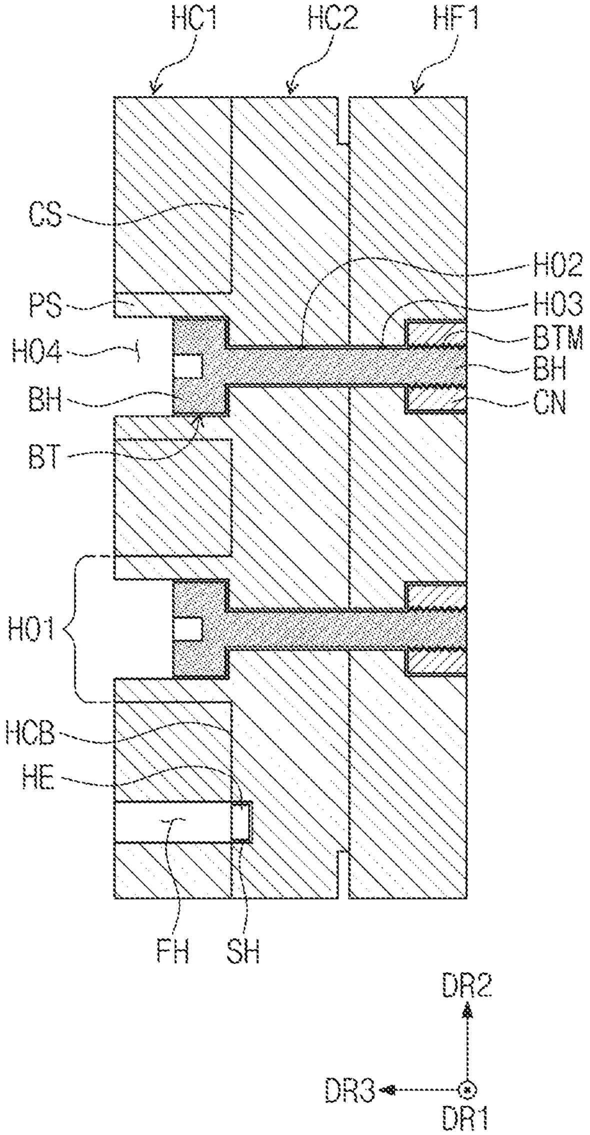
FIG. 13 is a cross-sectional view of an embodiment of a first heater cover, a second heater cover, a first fixing frame, and a coupling member according to the disclosure.

FIG. 13 is a cross-sectional view of a first heater cover HC1, a second heater cover HC2, a first fixing frame HF1, and a coupling member BT according to the disclosure.

Referring to FIG. 13, the first heater cover HC1, the second heater cover HC2, the first fixing frame HF1, and the coupling member BT may be substantially the same as those shown in FIG. 11 except for an arrangement direction of the coupling member BT and a position of a coupling nut CN, and thus, detailed descriptions of the same elements will be omitted.

A coupling head BH may be defined in one end of the coupling member BT, which is placed in a third through hole HO4. A lower surface of the coupling head BH may contact an upper surface of a cover member CS, and thus, the coupling head BH may be stably fixed to the cover member CS. Since a side surface of the coupling head BH is surrounded by a protruding structure PS, the coupling head BH may be spaced apart from the first heater cover HC1.

A thread BTM may be defined in the opposite end of the coupling member BT. The thread BTM may be coupled with the coupling nut CN. The coupling nut CN may be stably fixed to the first fixing frame HF1 by a step difference of a shape corresponding to the coupling nut CN defined in an inner side surface of the first fixing frame HF1, which defines a fastening hole HO3.

Although the embodiments of the disclosure have been described, it is understood that the disclosure should not be limited to these embodiments but various changes and modifications may be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims.

What is claimed is:

1. A deposition apparatus comprising:
a chamber providing an inner space; and
a deposition source which is accommodated in the inner space, the deposition source comprising:
an accommodation module accommodating a deposition material; and
a heater module which is disposed adjacent to an outer portion of the accommodation module and provides a heat to the deposition material, the heater module comprising:
a first heater cover of which a first surface faces the accommodation module, the first heater cover comprising an insulating material and provided with a first through hole defined therethrough;
a second heater cover facing a second surface of the first heater cover opposite to the first surface of the first heater cover, the second heater cover comprising an insulating material and provided with a second through hole defined therethrough;
a heater disposed between the second surface of the first heater cover and a first surface of the second heater cover;
a fixing frame which is coupled with a second surface of the second heater cover opposite to the first surface of the second heater cover, fixes the second heater cover and is provided with a fastening hole defined;
a coupling member inserted into the first through hole, the second through hole, and the fastening hole; and
a shielding cover covering a first end of the coupling member adjacent to the accommodation module and comprising an insulating material.

2. The deposition apparatus of claim 1, further comprising a shielding tube inserted into the first through hole and the second through hole and comprising an insulating material, wherein the coupling member is inserted into the shielding tube.

3. The deposition apparatus of claim 2, wherein the shielding tube has a height greater than a thickness of the second heater cover.

4. The deposition apparatus of claim 2, wherein at least one of the shielding cover and the shielding tube comprises boron nitride with a purity of about 95% or more.

5. The deposition apparatus of claim 1, wherein the coupling member comprises a thread defined at a second end of the coupling member opposite to the first end of the coupling member, and the thread is coupled with the fastening hole.

6. The deposition apparatus of claim 1, wherein the first heater cover is provided with a discharge hole defined therethrough to correspond to a shape of the heater in a plan view, and a heat generated from the heater is discharged through the discharge hole.

7. The deposition apparatus of claim 1, wherein at least one of the first heater cover and the second heater cover comprises boron nitride with a purity of about 95% or more.

8. The deposition apparatus of claim 1, wherein an inner side surface of the first heater cover, which defines the first through hole, has a step difference corresponding to the shielding cover.

9. The deposition apparatus of claim 1, wherein the fixing frame has a rigidity greater than a rigidity of each of the first heater cover and the second heater cover.

10. The deposition apparatus of claim 1, wherein the heater module is provided in plural, and at least one of the heater modules is disposed above the accommodation module.

11. The deposition apparatus of claim 1, further comprising a fixing member, wherein the first heater cover is provided with a first fixing hole defined therethrough, the second heater cover is provided with a second fixing hole defined therethrough, and the fixing member is inserted into the first fixing hole and the second fixing hole.

12. The deposition apparatus of claim 1, wherein at least one of the first heater cover and the second heater cover is provided with a seating recess corresponding to the heater to accommodate the heater.

13. A deposition apparatus comprising:

a chamber providing an inner space; and a deposition source accommodated in the inner space, the deposition source comprising:

an accommodation module accommodating a deposition material; and a heater module which is disposed adjacent to an outer portion of the accommodation module and provides a heat to the deposition material, the heater module comprising:

a first heater cover of which a first surface faces the accommodation module, the first heater cover comprising an insulating material and provided with a first through hole defined therethrough;

a second heater cover facing a second surface of the first heater cover opposite to the first surface of the first heater cover, the second heater cover comprising a cover member provided with a second through hole defined therethrough and a protruding structure protruding from the cover member and provided with a third through hole defined therethrough, and comprising an insulating material;

a heater disposed between the first heater cover and the cover member;

a fixing frame which is coupled with one surface of the second heater cover, fixes the second heater cover and is provided with a fastening hole defined therethrough; and a coupling member inserted into the second through hole, the third through hole, and the fastening hole, wherein the protruding structure is inserted into the first through hole.

14. The deposition apparatus of claim 13, further comprising a coupling nut, wherein the coupling member comprises a thread defined at a first end of the coupling member adjacent to the accommodation module, and the coupling nut is coupled with the thread.

15. The deposition apparatus of claim 14, wherein the coupling member comprises a coupling head defined at a second end of the coupling member, the second end of the coupling member is opposite to the first end of the coupling member, and an inner side surface of the fixing frame, which defines the fastening hole, has a step difference corresponding to the coupling head.

16. The deposition apparatus of claim 13, further comprising a coupling nut, wherein the coupling member comprises a coupling head defined at a first end of the coupling member adjacent to the accommodation module and a thread defined at a second end of the coupling member opposite to the first end of the coupling member, and the coupling nut is coupled with the thread.

17. The deposition apparatus of claim 16, wherein an inner side surface of the fixing frame, which defines the fastening hole, has a step difference corresponding to the coupling nut.

18. The deposition apparatus of claim 13, wherein at least one of the first heater cover and the second heater cover comprises boron nitride with a purity of about 95% or more.

19. The deposition apparatus of claim 13, wherein the fixing frame has a rigidity greater than a rigidity of each of the first heater cover and the second heater cover.

20. The deposition apparatus of claim 13, wherein the heater module is provided in plural, and at least one of the heater modules is disposed above the accommodation module.

* * * * *